(12) United States Patent
Saiki et al.

(10) Patent No.: US 8,247,503 B2
(45) Date of Patent: Aug. 21, 2012

(54) ADHESIVE COMPOSITION AND ADHESIVE SHEET

(75) Inventors: Naoya Saiki, Tokyo (JP); Hironori Shizuhata, Tokyo (JP); Isao Ichikawa, Tokyo (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 12/343,124

(22) Filed: Dec. 23, 2008

(65) Prior Publication Data

US 2009/0170284 A1  Jul. 2, 2009

(30) Foreign Application Priority Data

Dec. 28, 2007  (JP) .................................. 2007-339729

(51) Int. Cl.
*C08G 8/28* (2006.01)

(52) U.S. Cl. .......................... 525/504; 525/506; 523/211

(58) Field of Classification Search .................. 525/504, 525/506, 211
See application file for complete search history.

(56) References Cited

U.S. PATENT DOCUMENTS

| | | | | |
|---|---|---|---|---|
| 4,273,889 A | * | 6/1981 | Yamazaki et al. | ............. 525/109 |
| 4,448,940 A | * | 5/1984 | Koyama et al. | ............... 525/504 |
| 5,110,388 A | | 5/1992 | Komiyama et al. | |
| 5,118,567 A | | 6/1992 | Komiyama et al. | |
| 6,110,993 A | * | 8/2000 | Saito et al. | ..................... 523/211 |
| 6,277,481 B1 | | 8/2001 | Sugino et al. | |
| 6,303,219 B1 | * | 10/2001 | Sawamura et al. | ........... 428/343 |
| 2003/0031867 A1 | * | 2/2003 | Ogura et al. | .............. 428/355 R |

FOREIGN PATENT DOCUMENTS

| | | |
|---|---|---|
| EP | 0359373 A2 | 3/1990 |
| JP | 2032181 A | 2/1990 |
| JP | 8239636 A | 9/1996 |
| JP | 10008001 A | 1/1998 |
| JP | 2000017246 A | 1/2000 |

* cited by examiner

*Primary Examiner* — Julio J Maldonado
(74) *Attorney, Agent, or Firm* — The Webb Law Firm

(57) ABSTRACT

The object of the present invention is to provide an adhesive composition which can form a thinner adhesive layer, which has good storage stability and which can actualize high package reliability even when exposed to severe reflow conditions in a semiconductor package in which a semiconductor chip being reduced in a thickness is mounted, and an adhesive sheet having an adhesive layer comprising the adhesive composition.

The adhesive composition of the present invention comprises an epoxy thermosetting resin (A), a thermosetting agent (B) and a thermosetting accelerating agent (C); the thermosetting accelerating agent (C) being soluble in methyl ethyl ketone and inactive as a thermosetting accelerating agent at room temperature.

2 Claims, No Drawings

ADHESIVE COMPOSITION AND ADHESIVE SHEET

BACKGROUND OF THE INVENTION

1. Field of the Invention

The present invention relates to an adhesive composition which is particularly suited for using at a step of die-bonding a semiconductor element (semiconductor chip) on an organic substrate or a lead frame and a step of dicing a silicon wafer and the like and die-bonding a semiconductor chip on an organic substrate or a lead frame, an adhesive sheet having an adhesive layer comprising the above adhesive composition and a production process for a semiconductor device using the above adhesive sheet.

2. Description of the Related Art

A semiconductor wafer of silicon, gallium arsenide or the like is produced in a large size, and this wafer is cut and separated (dicing) into small element pieces (IC chips) of devices and then transferred to a bonding step which is a subsequent step. In this case, the semiconductor wafer is subjected to the respective steps of dicing, washing, drying, expanding and picking-up in the state that it is adhered and fixed in advance on an adhesive sheet, and then it is transferred to a bonding step which is a subsequent step. Furthermore, for such purposes as protecting a semiconductor chip from the surrounding environment and making it into a shape easily mountable on a printed board, a semiconductor package is produced, in some cases, by sealing a substrate on which an IC chip is bonded with a mold resin after the bonding step.

In order to simplify the picking-up step and the bonding step among the above steps, various adhesive sheets for dicing and die-bonding which are provided with both a wafer-fixing function and a die(IC chip)-adhering function at the same time are proposed (for example, refer to patent documents 1 to 4).

Adhesive sheets comprising an adhesive layer comprising a specific composition and a base material are disclosed in the patent documents 1 to 4. The above adhesive layer has a function of fixing a wafer in dicing the wafer, and irradiation thereof with an energy beam reduces an adhesive strength thereof and makes it possible to control the adhesive strength between the adhesive layer and the base material, so that when picking up the chip after finishing dicing, the adhesive layer is peeled off together with the chip. When the IC chip provided with the adhesive layer is mounted on a substrate and heated, an adhesive strength of a thermosetting resin contained in the adhesive layer is revealed to complete adhesion between the IC chip and the substrate.

The adhesive sheets disclosed in the patent documents described above enables so-called direct die-bonding and makes it possible to omit a step of coating an adhesive for adhering a die.

In recent years, a requirement for the reduction in thickness of semiconductor devices has become quite intense. Further, not only an IC chip but also an adhesive layer itself is required to be reduced in thickness. This is because the thickness of the adhesive layer that interposes between an IC chip and a substrate can not be neglected in a structure of a semiconductor device in which a number of IC chips are stacked.

Further, conventional adhesive sheets have poor storage stability because a curing component contained in the adhesive layer instantly reacts during the storage even at room temperature. Therefore, an adhesive sheet has been required that can be kept in storage at room temperature for an extended period of time from a few weeks to about one month.

To meet the requirement, there has been developed an adhesive sheet employing a granular dispersive latent thermosetting agent or thermosetting accelerating agent that has good storage stability.

However, the granular dispersive latent thermosetting agent or thermosetting accelerating agent is difficult to be dispersed uniformly in an adhesive layer. It is difficult to obtain smooth coating surface in the case of an adhesive layer of which the thickness is thin to the extent that the particle size can be no longer neglected. In addition, the structures of resultant thermoset articles are likely to be non-uniform and the properties thereof are largely fluctuated, which are of problem.

In the technique disclosed in the Patent Documents above, an adhesive composition having storage stability is attained by using a granular latent thermosetting agent. However, when the granular latent thermosetting agent is used, it is physically difficult to prepare an adhesive sheet with an adhesive layer having a thickness of less than or equal to the particle size of the thermosetting agent, and thus the recent requirement for reduction in thickness of semiconductor devices is not satisfied.

In a surface mounting carried out in connection of electronic parts in recent years, a surface mounting method in which the whole part of a package is exposed to high temperature of not lower than a melting point of a solder is carried out(reflow process). In recent years, a mounting temperature is elevated from 240° C. which has so far been carried out to 260° C. due to transfer to a solder containing no lead from the viewpoint of attentions to the environment to increase a stress produced in the inside of a semiconductor package, and the risk of causing package crack is further elevated.

Namely, with the reduction in thickness of semiconductor chips and the elevation of mounting temperature, an adhesive sheet having a thin adhesive layer and allowing the production of semiconductor devices endurable to a severe hot and humid environment is required. However, as described above, it is difficult to provide an adhesive sheet having a thin adhesive layer with the conventional adhesive compositions using the granular thermosetting agent.

Patent document 1: JP-A-1990-32181
Patent document 2: JP-A-1996-239636
Patent document 3: JP-A-1998-8001
Patent document 4: JP-A-2000-17246

SUMMARY OF THE INVENTION

As described above, the conventional adhesive sheets employ the granular dispersive latent thermosetting agent or thermosetting accelerating agent. In an adhesive layer, these are in the form of particles having a particle size of 10 to several 100s μm, having extremely small area contacting with an epoxy thermosetting resin, providing dramatically good storage stability.

However, it is physically difficult, as described above, to prepare an adhesive sheet having an adhesive layer with a thickness of less than or equal to the particle size of the thermosetting agent. There is a limit in controlling the particle size by pulverization or classification. In addition, as the particle size becomes small, the area contacting with the epoxy thermosetting resin increases, and with this, a disadvantage of short stable storage period of the composition emerges. Therefore, the conventional adhesive compositions that contain such the granular dispersive latent thermosetting agent or thermosetting accelerating agent have room for improvement in making them suitable for the production of a thin adhesive sheet.

As described above, there is a requirement for an adhesive sheet having a thin adhesive layer in a package in which a semiconductor chip being reduced in a thickness is mounted. In addition to that, the adhesive sheet is required to have good storage stability even the adhesive layer becomes thin and to actualize high package reliability even when exposed to severe reflow conditions.

The present invention has been made in light of the conventional arts described above, and an object thereof is to investigate an adhesive used for die-bonding and meet the requirements described above.

The present inventors have made an intensive study on adhesives and found that the object above can be achieved by an adhesive composition containing a thermosetting accelerating agent which is soluble in methyl ethyl ketone and inactive as a thermosetting accelerating agent at room temperature. Based on this finding, the present invention is accomplished.

The present invention comprises the following essentials.
[1] An adhesive composition comprising:
an epoxy thermosetting resin (A), a thermosetting agent (B) and a thermosetting accelerating agent (C);
the thermosetting accelerating agent (C) being soluble in methyl ethyl ketone and inactive as a thermosetting accelerating agent at room temperature.
[2] The adhesive composition according to [1], wherein the thermosetting accelerating agent (C) is a complex whose electron donor is an imidazole compound.
[3] The adhesive composition according to [2], wherein an electron acceptor of the complex whose electron donor is an imidazole compound is a compound containing a boron atom.
[4] The adhesive composition according to [3], wherein the compound containing a boron atom is a boron trifluoride.
[5] An adhesive sheet comprising a base material and, formed thereon, an adhesive layer comprising: an epoxy thermosetting resin (A), a thermosetting agent (B) and a thermosetting accelerating agent (C);
the thermosetting accelerating agent (C) being soluble in methyl ethyl ketone and inactive as a thermosetting accelerating agent at room temperature.
[6] The adhesive sheet according to [5], wherein the thermosetting accelerating agent (C) is a complex whose electron donor is an imidazole compound.
[7] The adhesive sheet according to [6], wherein an electron acceptor of the complex whose electron donor is an imidazole compound is a compound containing a boron atom.
[8] The adhesive sheet according to [7], wherein the compound containing a boron atom is a boron trifluoride.
[9] The adhesive sheet according to [5], wherein the thermosetting accelerating agent (C) in the adhesive layer has a maximum particle size of less than or equal to 1 µm.
[10] The adhesive sheet according to [5], wherein the adhesive layer has a thickness of less than or equal to 10 µm.
[11] A production process for a semiconductor device, comprising:
a step of providing an adhesive sheet comprising a base material and, formed thereon, an adhesive layer comprising, an epoxy thermosetting resin (A), a thermosetting agent (B) and a thermosetting accelerating agent (C), the thermosetting accelerating agent (C) being soluble in methyl ethyl ketone and inactive as a thermosetting accelerating agent at room temperature;
a step of adhering a semiconductor wafer on the adhesive layer of the adhesive sheet;
a step of dicing the semiconductor wafer;
a step of separating the diced semiconductor chip obtained by the dicing from the base material of the adhesive sheet while leaving at least a part of the adhesive layer firmly adhered to the semiconductor chip;
a step of thermally bonding the separated semiconductor chip on a die pad part or another semiconductor chip through the adhesive layer which firmly adheres to and remains on the semiconductor chip.
[12] The production process for a semiconductor device according to [11], wherein the thermosetting accelerating agent (C) is a complex whose electron donor is an imidazole compound.
[13] The production process for a semiconductor device according to [12], wherein an electron acceptor of the complex whose electron donor is an imidazole compound is a compound containing a boron atom.
[14] The production process for a semiconductor device according to [13], wherein the compound containing a boron atom is a boron trifluoride.
[15] The production process for a semiconductor device according to [11], wherein the thermosetting accelerating agent (C) in the adhesive layer has a maximum particle size of less than or equal to 1 µm.
[16] The production process for a semiconductor device according to [11], wherein the adhesive layer has a thickness of less than or equal to 10 µm.

According to the present invention, provided is an adhesive composition that is capable of providing a thin adhesive layer, excellent in storage stability and can achieve high package reliability even when exposed to severe reflow conditions in a semiconductor package in which a semiconductor chip being reduced in a thickness is mounted. Further, the present invention provides an adhesive sheet having an adhesive layer comprising the adhesive composition and a production process for a semiconductor device using the adhesive sheet.

DETAILED DESCRIPTION OF THE INVENTION

The adhesive composition, the adhesive sheet and the production process for a semiconductor device of the present invention shall be explained in detail below.

<Adhesive Composition>

The adhesive composition of the present invention (hereinafter also referred to merely as "the adhesive composition") comprises an epoxy thermosetting resin (A), a thermosetting agent (B) and a thermosetting accelerating agent (C) and is characterized by the fact that the thermosetting accelerating agent (C) is soluble in methyl ethyl ketone and inactive as a thermosetting accelerating agent at room temperature.

The adhesive composition of the present invention may contain other components described below in order to improve a variety of the physical properties. The each component shall specifically be explained below.

(A) Epoxy Thermosetting Resin:

As the epoxy thermosetting resin (A), various epoxy resins conventionally known can be used.

Examples of the epoxy resin include epoxy compounds having two or more functional groups in a molecule of the structural unit such as bisphenol A diglycidyl ether and hydrogenated compounds thereof, ortho-cresol novolak resins (the following Formula (1)), dicyclopentadiene type epoxy resins (the following Formula (2)), biphenyl type epoxy resins or biphenyl compounds (the following Formulae (3) or (4)).

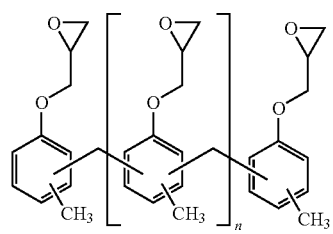

(1)

(wherein n is an integer of 0 or more),

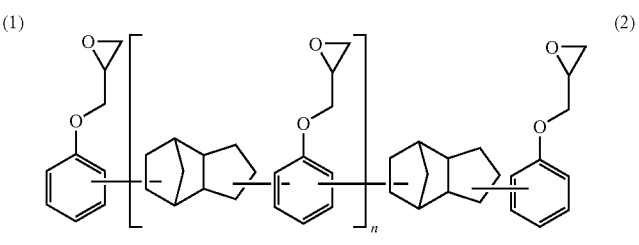

(2)

(wherein n is an integer of 0 or more),

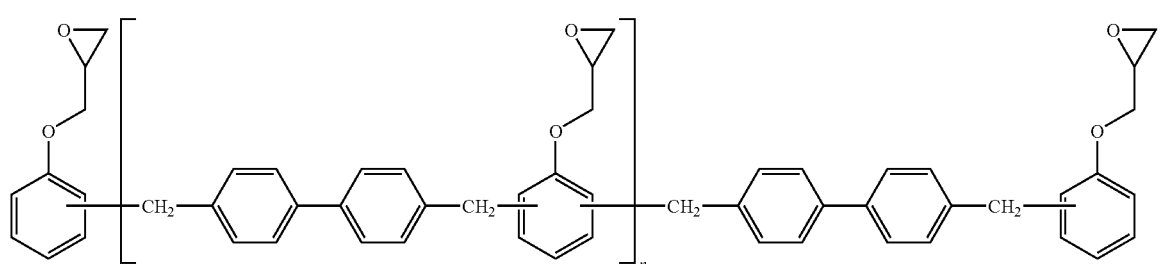

(3)

(wherein n is an integer of 0 or more),

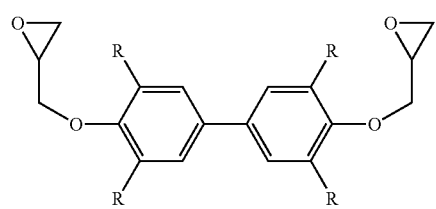

(4)

(wherein R is a hydrogen atom or a methyl group).

They can be used alone or in combination of two or more kinds thereof.

(B) Thermosetting Agent:

The thermosetting agent (B) is used to make the epoxy thermosetting resin (A) thermoset. Examples of the thermosetting agent (B) include compounds having two or more functional groups in a molecule which can react with an epoxy group, and examples of the functional group include a phenolic hydroxyl group, an alcoholic hydroxyl group, an amino group, a carboxyl group and an acid anhydride group. Among the above groups, a phenolic hydroxyl group, an amino group and an acid anhydride group are preferable, and a phenolic hydroxyl group and an amino group are more preferable.

The specific examples of them include phenolic thermosetting agents such as a novolak type phenol resin represented by the following Formula (5), a dicyclopentadiene phenol resin represented by the following Formula (6), a multifunctional phenol resin represented by the following Formula (7) and an aralkyl phenol resin represented by the following Formula (8). The above thermosetting agents can be used alone or in a mixture of two or more kinds thereof.

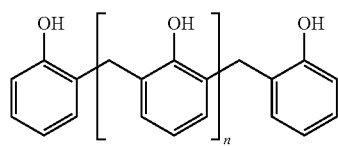

(5)

(wherein n is an integer of 0 or more),

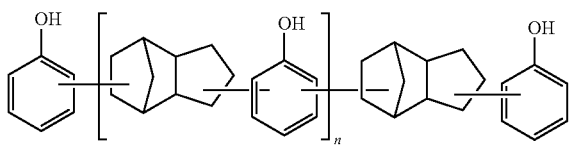

(6)

(wherein n is an integer of 0 or more),

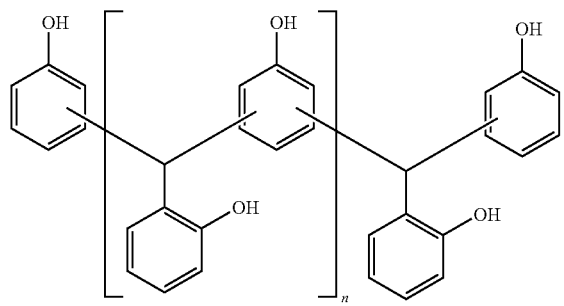

(wherein n is an integer of 0 or more), (7)

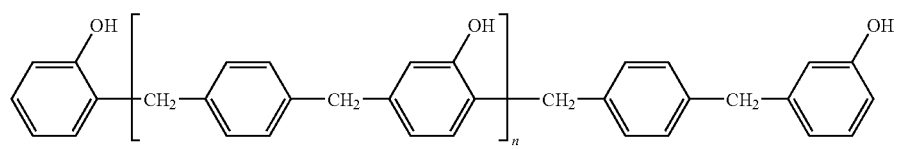

(wherein n is an integer of 0 or more). (8)

The thermosetting agent (B) is contained in an amount of preferably 0.1 to 500 parts by weight, more preferably 1 to 200 parts by weight with respect to 100 parts by weight of the total of the epoxy thermosetting resin (A). If an amount of the thermosetting agent (B) is small, the adhesiveness is not obtained in a certain case due to poor thermosetting, and if it is excessive, the moisture absorptivity increases to reduce a reliability of the package in a certain case.

(C) Thermosetting Accelerating Agent:

The thermosetting accelerating agent (C) is used in order to adjust thermal curing rate of the adhesive composition and to prevent degradation of the adhesiveness of the adhesive composition when it is kept in storage.

The thermosetting accelerating agent (C) used in the adhesive composition according to the present invention is soluble in methyl ethyl ketone and inactive as a thermosetting accelerating agent at room temperature.

When an adhesive sheet is produced by using the adhesive composition of the present invention, in some cases, the adhesive composition is diluted with a solvent, the resulting solution is coated on a base material, and then the solvent is vaporized. The essential components of the adhesive composition (the epoxy thermosetting resin (A), the thermosetting agent (B) and the thermosetting accelerating agent (C)) are adequately dissolved in methyl ethyl ketone, and methyl ethyl ketone easily vaporizes after the adhesive composition is dissolved in it and the resulting solution is coated on a base material.

In the present specification, "room temperature" denotes a temperature range of 18 to 28° C. "Soluble" denotes that particles having a maximum particle size of larger than 1 μm become unpresent in a solvent. "Maximum particle size" denotes a particle size of a particle that has the largest particle size among plural particles.

More detail explanation about that the thermosetting accelerating agent (C) is soluble in methyl ethyl ketone and is inactive as a thermosetting accelerating agent at room temperature is as follows: the thermosetting accelerating agent (C) used in the adhesive composition according to the present invention is soluble in methyl ethyl ketone, and is inactive as a themosetting accelerating agent at room temperature when methyl ethyl ketone is vaporized after dissolving the adhesive composition in the methyl ethyl ketone.

As described above, in producing an adhesive sheet, the adhesive composition is diluted with a solvent such as methyl ethyl ketone and the resulting solution is coated on a base material, and then the solvent is vaporized to obtain an adhesive layer. In this occasion, the conventional granular dispersive latent thermosetting agents or thermosetting accelerating agents are not dissolved in the solvent, remaining in the adhesive layer obtained after vaporization of the solvent in the form of particles having a particle size of 10 to several 100s μm, having small area contacting with the epoxy thermosetting resin, and thus good storage stability is exhibited, as described in the section of "SUMMARY OF THE INVENTION".

Further, the conventional granular dispersive latent thermosetting agents or thermosetting accelerating agents include the one that is dissolved in a specific solvent. Such thermosetting accelerating agent is considered to be almost uniformly dispersed in an adhesive layer after it is dissolved in the specific solvent, having a large area contacting with the epoxy thermosetting resin. The conventional thermosetting accelerating agent becomes active as a thermosetting accelerating agent because the area contacting with the epoxy thermosetting resin becomes large. On the other hand, the thermosetting accelerating agent (C) used in the adhesive composition of the present invention remains inactive as a thermosetting accelerating agent at room temperature even after it is dissolved in a solvent. The reason about this will be described later.

Next, in order to explain the meaning of "inactive as a thermosetting accelerating agent", the reaction of a thermosetting accelerating agent is explained first. The explanation will be made in the context of an example where the thermosetting accelerating agent is an imidazole compound, the thermosetting agent is a phenol resin, and the thermosetting resin is an epoxy resin: the imidazole compound takes away a proton from a phenolic hydroxyl group of the phenol resin, by which the nucleophilicity of the phenolic hydroxyl group is enhanced; the phenolic hydroxyl group makes a nucleophilic attack to an epoxy group of the epoxy resin, so that the ring-opening reaction of the phenol resin with the epoxy resin is accelerated. In other words, the imidazole compound (thermosetting accelerating agent) functions as a catalyst accelerating the reaction of the phenol resin with the epoxy resin.

The "inactive as a thermosetting accelerating agent at room temperature" means that the thermosetting accelerating agent exhibits substantially no catalytic function described above at room temperature.

The thermosetting accelerating agent that is soluble in methyl ethyl ketone and is inactive as a thermosetting accelerating agent at room temperature includes boron trifluoride 2-methylimidazole and the like.

Further, as the thermosetting accelerating agent being soluble in methyl ethyl ketone and inactive as a thermosetting accelerating agent at room temperature, a complex whose electron donor is an imidazole compound is preferable, a complex whose electron donor is an imidazole compound and whose electron acceptor is a compound containing a boron atom is more preferable, and a complex whose electron donor is an imidazole compound and whose electron acceptor is a boron trifluoride is still more preferable. Note that, in the present specification, the imidazole compound denotes imidazole itself and a compound that is obtained by substituting a hydrogen atom that is bonded to the carbon or nitrogen atom of imidazole for an alkyl group having 1 to 10 carbon atoms, a phenyl group, or the like.

Conventionally used granular dispersive latent thermosetting agents or thermosetting accelerating agents are present in an adhesive layer comprising an adhesive composition in the form of particles having a particle size of 10 to several 100s µm, therefore, it is difficult to disperse them uniformly in the adhesive layer, and a problem of large fluctuation in physical properties of the adhesive layer is caused. Further, because of large particle size, there has been a trouble in preparing an adhesive sheet having a thin adhesive layer that meets the recent requirement for the reduction in thickness of semiconductor chips. Still further, when the particle size of conventional granular dispersive latent thermosetting agents or thermosetting accelerating agents is decreased so as to obtain a thin adhesive layer, the area contacting with the thermosetting resin increases, and thus the conventional granular dispersive latent thermosetting agents or thermosetting accelerating agents have a disadvantage that the stable storage period of the adhesive sheet becomes short.

On the other hand, the thermosetting accelerating agent (C) used in the present invention can be present in the adhesive layer in the form of quite small fine particles having a maximum particle size of less than or equal to 1 µm, therefore, the thermosetting accelerating agent (C) is dispersed uniformly in the adhesive layer and cause no trouble in the preparation of an adhesive sheet having a thin adhesive layer. In addition to that, the thermosetting accelerating agent (C) has a smaller particle size than the conventional granular dispersive latent thermosetting agents or thermosetting accelerating agents in the adhesive layer, although the area contacting with the epoxy thermosetting resin is large, the thermosetting accelerating agent (C) does not have a disadvantage that the stable storage period of the adhesive sheet is short, as is clear from the Examples described later.

The reason for that is considered that, when explained in the context of an example where the thermosetting accelerating agent (C) is a complex whose electron donor is an imidazole compound, the electron acceptor in the complex blocks, at room temperature, the reaction site functioning as a thermosetting accelerating agent, and the electron acceptor is removed from the reaction site when exposed to high temperature such as heat curing in a bonding process.

The thermosetting accelerating agent (C) is contained in an amount of preferably 0.0001 to 20 parts by weight, more preferably 0.001 to 10 parts by weight and still more preferably 0.005 to 3.0 parts by weight with respect to 100 parts by weight of the total of the epoxy thermosetting resin (A) and the thermosetting agent (B). At less than 0.0001 part by weight, thermosetting accelerating effect may not be obtained, on the other hand, at more than 20 parts by weight, the storage stability of the adhesive sheet may become lowered.

The adhesive composition according to the present invention contains the epoxy thermosetting resin (A), the thermosetting agent (B) and the thermosetting accelerating agent (C) as essential components. Because the thermosetting accelerating agent (C) is soluble in methyl ethyl ketone and is inactive as a thermosetting accelerating agent at room temperature, by using the adhesive composition of the present invention, an adhesive sheet can be obtained which has a thin adhesive layer, which is excellent in storage stability and which can achieve high package reliability even when exposed to severe reflow conditions.

The adhesive composition according to the present invention may further comprise the following components in order to improve a variety of the physical properties if necessary.

(D): Acrylic Polymer

An acrylic polymer (D) can be contained in the adhesive composition of the present invention to improve the film strength of the adhesive layer of the adhesive sheet. The acrylic polymer (D) has a weight average molecular weight of preferably 10,000 to 2,000,000, more preferably 100,000 to 1,500,000. It should be noted that the value of weight average molecular weight in the present specification is all based on the polystyrene equivalent by GPC method. If the acrylic polymer (D) has a too low weight average molecular weight, the adhesive strength of the adhesive layer comprising the adhesive composition with the base material is high, and inferior picking-up may be caused in the aforementioned picking-up step. On the other hand, if it exceeds 2,000,000, the adhesive layer may not follow irregularities on the substrate in the aforementioned bonding step, and it is the cause of bringing about voids.

The acrylic polymer (D) has a glass transition temperature (Tg) falling in a range of preferably −30° C. to 50° C., more preferably −15° C. to 40° C. and particularly preferably −5° C. to 30° C. If the glass transition temperature is too low, an adhesive strength between the adhesive layer and the base material is increased, and inferior picking-up is caused in a certain case. On the other hand, if it is too high, the adhesive strength for fixing a wafer is likely to be unsatisfactory.

Examples of monomers of the acrylic polymer (D) include acrylic acid, methacrylic acid, itaconic acid, (meth)acrylic acid ester monomer and derivatives thereof and the like.

Examples of the (meth)acrylic acid ester monomer and derivatives thereof include alkyl (meth)acrylates in which the alkyl group has 1 to 18 carbon atoms such as methyl acrylate, methyl methacrylate, ethyl acrylate, ethyl methacrylate, propyl acrylate, propyl methacrylate, butyl acrylate, butyl methacrylate, 2-ethylhexyl acrylate and 2-ethylhexyl methacrylate and the like. Furthermore, mention may be made of 2-hydroxyethyl acrylate, 2-hydroxyethyl methacrylate, 2-hydroxypropyl acrylate, 2-hydroxypropyl methacrylate which have a hydroxyl group, further, glycidyl acrylate, glycidyl methacrylate and the like as the alkyl (meth)acrylic acid esters in which the alkyl group has 1 to 18 carbon atoms.

Examples thereof also include (meth)acrylic esters having a cyclic skeleton such as cycloalkyl ester acrylate, isobornyl acrylate, dicyclopentanyl acrylate, dicyclopentenyl acrylate, dicyclopentenyl oxyethyl acrylate, imido acrylate, benzyl acrylate and benzyl methacrylate and the like.

As a monomer of the acrylic polymer (D), the acrylic polymer having a hydroxyl group is preferred from the viewpoint of good compatibility with epoxy thermosetting resin.

They can be used alone or in combination of two or more kinds thereof.

The acrylic polymer (D) may be copolymerized with vinyl acetate, acrylonitrile, styrene and the like.

The acrylic polymer (D) is contained in an amount of preferably 1 to 10000 parts by weight, more preferably 10 to 1000 parts by weight with respect to 100 parts by weight of the total of the epoxy thermosetting resin (A).

(E): Coupling Agent:

The coupling agent (E) is used in order to enhance an adhesion of the adhesive composition to an adherend. Use of the coupling agent (E) makes it possible to improve a water resistance of a cured product obtained by thermosetting the adhesive composition without damaging a heat resistance of the cured product. Compounds having groups which react with functional groups present in the epoxy thermosetting resin (A) and the acrylic polymer (D) are preferably used as the coupling agent (E).

Specifically, the coupling agent (E) is preferably a silane coupling agent.

Examples of the above coupling agent include γ-glycidoxypropyltrimethoxysilane, γ-glycidoxypropylmethyldiethoxysilane, β-(3,4-epoxycyclohexyl)ethyltrimethoxysilane, γ-(methacryloxypropyl)trimethoxysilane, γ-aminopropyltrimethoxysilane, N-6-(aminoethyl)-γ-aminopropyltrimethoxysilane, N-6-(aminoethyl)-γ-aminopropylmethyldiethoxysilane, N-phenyl-γ-aminopropyltrimethoxysilane, γ-ureidopropyltriethoxysilane, γ-mercaptopropyltrimethoxysilane, γ-mercaptopropylmethyldimethoxysilane, bis(3-triethoxysilylpropyl)tetrasulfane, methyltrimethoxysilane, methyltriethoxysilane, vinyltrimethoxysilane, vinyltriacetoxysilane and imidazolesilane and the like.

They can be used alone or in mixture of two or more kinds thereof.

When the coupling agent (E) is used, a content of the coupling agent (E) in the adhesive composition is usually 0.1 to 20 parts by weight, preferably 0.2 to 10 parts by weight, and more preferably 0.3 to 5 parts by weight with respect to 100 parts by weight of the epoxy thermosetting resin (A) or of the total of the epoxy thermosetting resin (A) and the acrylic polymer (D) when the acrylic polymer (D) is contained in the adhesive composition. When it is less than 0.1 part by weight, the effects might not be obtained, and when it exceeds 20 parts by weight, outgas might occur.

(F) Cross-Linking Agent:

A cross-linking agent (F) can be added in order to control an initial adhesive strength and a cohesion of the adhesive composition. The cross-linking agent (F) includes organic polyvalent isocyanate compounds and organic polyvalent imine compounds and the like.

Examples of the organic polyvalent isocyanate compounds include aromatic polyvalent isocyanate compounds, aliphatic polyvalent isocyanate compounds, alicyclic polyvalent isocyanate compounds, trimers of the above polyvalent isocyanate compounds and end isocyanate urethane prepolymers obtained by reacting the above polyvalent isocyanate compounds with polyol compounds and the like.

More specific examples of the organic polyvalent isocyanate compounds include 2,4-tolylenediisocyanate, 2,6-tolylenediisocyanate, 1,3-xylylenediisocyanate, 1,4-xylenediisocyanate, diphenylmethane-4,4'-diisocyanate, diphenylmethane-2,4'-diisocyanate, 3-methyldiphenylmethanediisocyanate, hexamethylenediisocyanate, isophoronediisocyanate, dicyclohexylmethane-4,4'-diisocyanate, dicyclohexylmethane-2,4'-diisocyanate and lysineisocyanate and the like.

Specific examples of the organic polyvalent imine compounds include N,N'-diphenylmethane-4,4'-bis(1-aziridinecarboxyamide), trimethylolpropane-tri-β-aziridinyl propionate, tetramethylolmethane-tri-β-aziridinyl propionate and N,N'-toluene-2,4-bis(1-aziridinecarboxyamide)triethylenemelamine and the like.

They can be used alone or in combination of two or more kinds thereof.

When using the cross-linking agent (F), a content of the cross-linking agent (F) is usually 0.01 to 10 parts by weight, preferably 0.1 to 5 parts by weight and more preferably 0.5 to 3 parts by weight with respect to 100 parts by weight of the acrylic polymer (D).

(G) Energy Beam-Polymerizable Compound:

The adhesive composition of the present invention may be blended with an energy beam-polymerizable compound (G). The adhesive strength of the adhesive layer can be reduced by curing the energy beam-polymerizable compound (G) by irradiation with an energy beam and thus interlayer separation between the base material and the adhesive layer in transferring an IC chip to a bonding step can readily be carried out. It should be noted that, since the adhesive strength between the adhesive layer and the chip is usually greater than that between the base material and the adhesive layer, the IC chip is not separated from the adhesive layer during the interlayer separation.

The energy beam-polymerizable compound (G) is a compound which is polymerized and cured by irradiation with an energy beam such as a UV ray and an electron beam.

Specific examples of the energy beam-polymerizable compound (G) include acrylate base compounds such as trimethylolpropane triacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate, oligo ester acrylate, urethane acrylate oligomers, epoxy-modified acrylate, polyether acrylate and itaconic acid oligomers.

These compounds have at least one polymerizable double bond in a molecule, and they have a weight average molecular weight of usually 100 to 30,000, preferably 300 to about 10,000.

They can be used alone or in combination of two or more kinds thereof.

When using the energy beam-polymerizable compound (G), a content of the energy beam-polymerizable compound (G) in the adhesive composition is usually 1 to 40 parts by weight, preferably 3 to 30 parts by weight and more preferably 3 to 20 parts by weight with respect to 100 parts by weight of the epoxy thermosetting resin (A) or of the total of the epoxy thermosetting resin (A) and the acrylic polymer (D) when the acrylic polymer (D) is contained in the adhesive composition. If it exceeds 40 parts by weight, the adhesion of the adhesive layer to an organic substrate and a lead frame is reduced in a certain case.

(H) Photopolymerization Initiator:

In using the adhesive composition of the present invention, it is irradiated with an energy beam such as a UV ray to reduce an adhesive strength in a certain case. In this case, addition of a photopolymerization initiator (H) to the above composition makes it possible to reduce the polymerization and curing time and the beam irradiation dose.

Specific examples of the photopolymerization initiator (H) include benzophenone, acetophenone, benzoin, benzoin methyl ether, benzoin ethyl ether, benzoin isopropyl ether, benzoin isobutyl ether, benzoin benzoate, benzoin methyl benzoate, benzoin dimethyl ketal, 2,4-diethylthioxanthone, α-hydroxycyclohexyl phenyl ketone, benzyl diphenyl sulfide, tetramethylthiuram monosulfide, azobisisobutyronitrile, diacetyl and β-chloroanthraquinone and the like. The photopolymerization initiator (H) can be used alone or in combination of two or more kinds thereof.

A blending proportion of the photopolymerization initiator (H) has to be determined, to be theoretical, based on an amount of an unsaturated bond present in the adhesive, a reactivity thereof and a reactivity of the photopolymerization initiator used, but it is not necessarily easy in a complicated mixture system.

When using the photopolymerization initiator (H), a content of the photopolymerization initiator (H) in the adhesive composition is, as a general guideline, preferably 0.1 to 10 parts by weight, more preferably 1 to 5 parts by weight with respect to 100 parts by weight of the total of the energy beam-polymerizable compound (G). If it is less than 0.1 part by weight, the satisfactory picking-up property is not obtained due to lack of photopolymerization in a certain case. If it exceeds 10 parts by weight, residues which do not contribute to the photopolymerization are produced, and a curing property of the adhesive is unsatisfactory in a certain case.

(I) Inorganic Filler:

Blending of the adhesive composition with an inorganic filler (I) makes it possible to control the thermal expansion coefficient, and optimization of a thermal expansion coefficient of the adhesive layer after thermal cured to an semiconductor chip, a metal or an organic substrate makes it possible to enhance a reliability of the package. Further, a moisture absorptivity of the adhesive layer after thermal cured can be reduced.

Examples of the preferred inorganic filler include powders of silica, alumina, talc, calcium carbonate, titan white, red iron oxide, silicon carbide, boron nitride and the like, beads obtained by sphering the above compounds, monocrystalline fibers, glass fibers and the like.

They can be used alone or in a mixture of two or more kinds thereof.

In the present invention, among them, silica powder and alumina powder are preferably used.

The amount of the inorganic filler (I) can be controlled in a range of usually 0 to 80% by weight based on the whole adhesive composition.

Other Components:

The adhesive composition of the present invention may be blended, if necessary, with various additives in addition to the components described above.

For example, a flexible component can be added in order to maintain the flexibility of the adhesive layer after cured. The flexible component is a component which has flexibility at room temperature and under heating, and what is not substantially cured by heating or irradiating with an energy beam is selected.

The flexible component may be a polymer comprising a thermoplastic resin or an elastomer or may be a graft component of a polymer or a block component of a polymer. Further, the flexible component may be a modified resin which is modified in advance with an epoxy resin.

Further, a plasticizer, an antistatic agent, an antioxidant, a pigment, a dye and the like may be used as the various additives for the adhesive composition.

The adhesive composition comprising the components described above has a pressure sensitiveness and a thermosetting property, and the composition in a non-cured state has a function of temporarily holding various adherends. It can provide finally a cured product having a high impact resistance through thermosetting, and in addition thereto, it is excellent in a balance between a shearing strength and a peeling strength and can maintain a satisfactory adhesive property even when exposed to a severe hot and humid condition.

Furthermore, because the adhesive composition according to the present invention contains a thermosetting accelerating agent which is soluble in methyl ethyl ketone and inactive as a thermosetting accelerating agent at room temperature, by using the adhesive composition according to the present invention, an adhesive sheet can be produced which has a thin adhesive layer, which is excellent in storage stability and which can achieve high package reliability even when exposed to severe reflow conditions.

The adhesive composition according to the present invention is obtained by mixing the respective components described above in suitable proportions. In mixing, the above components may be diluted in advance by a solvent or the solvent may be added in mixing.

Examples of the solvent include methyl ethyl ketone, acetone, toluene, ethyl acetate, methyl isobutyl ketone and the like. Methyl ethyl ketone is preferred because it can sufficiently dissolve the essential components of the adhesive composition and is easily vaporized after the adhesive composition is dissolved in methyl ethyl ketone and the resulting solution is coated on a base material.

<Adhesive Sheet>

According to the present invention, there is provided an adhesive sheet using the adhesive composition described above.

The adhesive sheet according to the present invention (hereinafter also referred to merely as "the adhesive sheet") comprises a base material and, formed thereon, an adhesive layer comprising the adhesive composition described above. The adhesive sheet can have all forms such as a tape form, a label form and the like.

Base Material

Used as the base material for the adhesive sheet are, for example, transparent films such as a polyethylene film, a polypropylene film, a polybutene film, a polybutadiene film, a polymethylpentene film, a polyvinyl chloride film, a vinyl chloride copolymer film, a fluororesin film, a polyethylene terephthalate film, a polyethylene naphthalate film, a polybutylene terephthalate film, a polyurethane film, an ethylene vinyl acetate copolymer film, an ionomer resin film, an ethylene (meth)acrylic acid copolymer film, an ethylene (meth) acrylic ester copolymer film, a polystyrene film, a polycarbonate film, a polyimide film and the like.

Also, cross-linked films thereof may be used as well. Further, laminated films thereof may be used.

In addition to the transparent films described above, opaque films obtained by coloring the above films and the like can be used. However, when irradiation with an energy beam such as UV ray from a base material side is performed in using the adhesive sheet according to the present invention, the base material is preferably transmittable to the energy beam used.

The adhesive sheet according to the present invention is adhered on various adherends, and after the adherends are subjected to required processing such as dicing, the adhesive layer is separated from the base material while firmly adhering and remaining on the adherend. That is, the adhesive sheet according to the present invention is used for a process including a step of transferring the adhesive layer from the base material onto the adherend. Accordingly, a face of the base material brought into contact with the adhesive layer has a surface tension of preferably 40 mN/m or less, more preferably 37 mN/m or less and particularly preferably 1 to 35 mN/m. The base material having such a low surface tension can be obtained by suitably selecting materials, and it can be obtained as well by subjecting the surface of the base material to releasing treatment by coating a release agent on it.

Release agents of an alkid base, a silicone base, a fluorine base, an unsaturated polyester base, a polyolefin base and a wax base are used as the release agent used for the peeling treatment of the base material. In particular, the release agents of an alkid base, a silicone base and a fluorine base are preferred since they have a heat resistance.

In order to subject the surface of the base material to peeling treatment with the release agent, the release agent without dissolving in a solvent or the release agent which is diluted or emulsified with a solvent is applied by means of a gravure coater, a Mayor bar coater, an air knife coater, a roll coater and the like and cured at room temperature or by heating or by irradiating with an electron beam, or a laminate is formed by wet lamination, dry lamination, hot melt lamination, melt extrusion lamination, coextrusion working and the like.

The base material has a film thickness of usually about 10 to 500 μm, preferably about 15 to 300 μm and particularly preferably about 20 to 250 μm.

The adhesive layer has a thickness of usually about 0.01 to 150 μm, preferably about 0.1 to 50 μm and particularly preferably about 0.5 to 10 μm. This thickness could meet the requirements for the reduction in thickness of semiconductor chip in recent years. The maximum particle size of the thermosetting accelerating agent (C) in the adhesive layer is usually less than or equal to 1 μm, preferably less than or equal to 0.1 μm.

Such an adhesive sheet which has a thin adhesive layer and which is good in storage stability can be produced by using the adhesive composition according to the present invention.
Production Process for the Adhesive Sheet The adhesive sheet according to the present invention is produced from the base material and the adhesive composition described above.

A production process for the adhesive sheet shall not specifically be restricted. It may be produced by coating the adhesive composition constituting the adhesive layer on a base material and drying it or may be produced by providing the adhesive layer on a release film and transferring it onto the base material. A release film may be laminated on an upper face of the adhesive layer in order to protect the adhesive layer before using the adhesive sheet. Furthermore, a pressure sensitive adhesive layer may be separately provided at an outer circumferential part of the surface of the adhesive layer in order to fix jigs such as a ring frame.

<Production Process for a Semiconductor Device Using the Adhesive Sheet>

According to the present invention, a production process for a semiconductor device using the aforementioned adhesive sheet is also provided.

In the production processes for a semiconductor device according to the present invention, the adhesive sheet according to the present invention is fixed on a dicing equipment with a ring frame, and one face of a silicon wafer is placed on the adhesive layer of the adhesive sheet and slightly pressed to fix the wafer.

Then, when the adhesive composition contains the energy beam-polymerizable compound (G), the adhesive layer is irradiated with an energy beam from a base material side to enhance a cohesion of the adhesive layer, whereby an adhesive strength between the adhesive layer and the base material is reduced. An ultraviolet ray (UV), an electron beam (EB) or the like is used as the energy beam irradiated, and a UV ray is preferably used.

Then, the silicon wafer described above is cut by means of a cutting means such as a dicing saw to obtain IC chips. In this case, the cut depth is a depth determined by adding the total of a thickness of the silicon wafer and a thickness of the adhesive layer and an abraded part of the dicing saw.

Irradiation with an energy beam may be carried out at any stage of after adhering the semiconductor wafer and before separating the IC chip. It may be carried out, for example, after dicing or may be carried out after an expanding step described below. Further, irradiation with an energy beam may be carried out dividing into plural times.

Then, expanding of the adhesive sheet carried out if necessary enlarges an interval between the IC chips to cause deviation between the adhesive layer and the base material, whereby an adhesive strength between the adhesive layer and the base material is reduced, and as a result, picking-up of the IC chip is readily carried out.

Picking-up of the IC chip carried out in the manner described above makes it possible to separate the adhesive layer from the base material while firmly adhering the cut adhesive layer on a back face of the IC chip to allow it to remain thereon. Examples of method for separating the adhesive layer from the base material include peeling the adhesive layer from the base material.

Then, the IC chip is mounted on a die pad part through the adhesive layer. The die pad part is heated before mounting the IC chip or immediately after mounting. The heating temperature is usually 80 to 200° C., preferably 100 to 180° C. The heating time is usually 0.1 seconds to 5 minutes, preferably 0.5 seconds to 3 minutes, and the die-bonding pressure is usually 1 kPa to 200 MPa.

After the IC chip is die-bonded on the die pad part, it may be further heated if necessary. In this case, the heating condition falls in the range of the heating temperature described above, and the heating time is usually 1 to 180 minutes, preferably 10 to 120 minutes. The IC chip is sealed with resin in a sealing step after it is mounted, in some cases. At this time, heating is usually performed at 150 to 180° C. for around 1 to 8 hours so as to cure the sealing resin. Hence, for the above heating, this heating may be used.

The semiconductor device is produced by passing through these steps. The adhesive layer is cured by passing through the above steps, and the IC chip can firmly be adhered onto the die pad part. The adhesive layer is fluidized under a die bonding condition, and therefore it is sufficiently embedded into irregularities of the die pad part and can prevent voids from being produced.

That is, in the mounted product obtained, the adhesive layer which is a firmly adhering means for the IC chip is cured and is sufficiently embedded into the irregularities of the die pad part, and therefore the satisfactory package reliability and board mounting property are achieved even under severe conditions.

An embodiment where an IC chip is die-bonded onto a die pad part is explained above, but this is one embodiment of the production process for a semiconductor device of the present invention. As another embodiment of the production process for a semiconductor device of the present invention, mention may be made of an embodiment where an IC chip is die-bonded onto another IC chip.

The adhesive composition and the adhesive sheet according to the present invention can be used as well for adhering semiconductor compounds, glass, ceramics, metals and the like in addition to the applications described above.

EXAMPLES

Hereinbelow, the present invention shall be explained in detail with reference to examples, but the present invention shall not be restricted to these examples. In the following examples and comparative examples, evaluation was carried out in the following manner.

[Coatability of 5 μm Thick Adhesive Layer]

Adhesive sheets having a 5 μm thick adhesive layers were prepared as described in Examples and Comparative Examples. A case where a good adhesive sheet was prepared was rated as "good". A case where coating could not be carried out by particle clogging when coating, or a case where the surface condition of the adhesive layer was bad in such a manner that coating streaks were developed on the adhesive layer of the obtained adhesive sheet or the adhesive layer lacked smoothness, was rated as "bad".

[Evaluation of Surface Mounting Property After Long Storage]

(1) Production of Semiconductor Chip

First, adhesive sheets which comprised a base material and, formed thereon, an adhesive layer and which were prepared in Examples and Comparative Examples were left for one month in the 28° C. air under a light-shielded condition. The left adhesive sheets were then adhered on a ground surface of a #2000 ground silicon wafer (150 mm diameter and thickness 150 μm) by means of a tape mounter (Adwill RAD2500, manufactured by Lintec Corporation), and the silicon wafer adhered on the adhesive sheet was fixed at a ring frame for wafer dicing.

Then irradiation (350 mW/cm$^2$, 190 mJ/cm$^2$) with a UV ray from the base material side by means of a UV ray irradiating equipment (Adwill RAD2000, manufactured by Lintec Corporation) was carried out.

Then, the silicon wafer was diced into a chip size of 8 mm×8 mm by means of a dicing equipment (DFD651, manufactured by DISCO CORPORATION). A cut amount in dicing was such that the base material of the adhesive sheet was cut into by 20 μm.

(2) Production of Semiconductor Package

Used as a substrate was a substrate (LN001E-001 PCB (Au)AUS303, manufactured by Chino Giken Co., Ltd.) in which circuit patterns were formed at a copper foil (thickness 18 μm) of a copper foil-clad laminate (CCL-HL830, manufactured by Mitsubishi Gas Chemical Co., Inc.) and in which a solder resist (PSR4000 AUS303, manufactured by Taiyo Ink MFG. Co., Ltd.) was provided on the patterns.

The IC chip obtained in (1) described above on the adhesive sheet was taken up from the base material together with the adhesive layer, and it was pressed and bonded on the substrate through the adhesive layer on the conditions of 120° C., 100 gf and 1 second. Then, the substrate was sealed with a mold resin (KE-1100AS3, manufactured by KYOCERA Chemical Corporation) so that a sealing thickness was 400 μm (sealing equipment: MPC-06M TriAl Press, manufactured by APIC YAMADA CORPORATION), and the mold resin was cured at 175° C. for 5 hours.

Then, the sealed substrate was adhered on a dicing tape (Adwill D-510T, manufactured by Lintec Corporation) and diced into a size of 12 mm×12 mm by means of the dicing equipment (DFD651, manufactured by DISCO CORPORATION), whereby a semiconductor package for evaluating reliability was obtained.

(3) Evaluation of Surface Mounting Property of Semiconductor Package

The semiconductor package obtained was left standing for 168 hours under the condition of 85° C. and 60% RH and allowed to absorb moisture, and then IR reflow (reflow furnace: WL-15-20DNX, manufactured by Sagami-Rikou Co., Ltd.) was carried out three times at a maximum temperature of 260° C. and a heating time of 1 minute to evaluate the presence of floating and peeling at the adhered part and the presence of cracks produced in the package by means of a scanning type ultrasonic flaw detector (Hye-Focus, manufactured by Hitachi Kenki Fine Tech and Co., Ltd.) and observation of the cross-section.

A case in which peeling of 0.5 mm or more was observed at the adhered part of the semiconductor chip and the substrate was judged as peeling, and 25 pieces of the packages were subjected to the test to count the number of the packages which did not bring about peeling.

[Evaluation of Adhesive Strength After Long Storage]

First, adhesive sheets prepared in Examples and Comparative Examples were left for one month in the 28° C. air under a light-shielded condition. The left adhesive sheets were laminated onto an ground surface of a #2000 ground silicon wafer (having a thickness of 350 μm), using a laminator (laminator manufactured by Taisei Laminator Co., Ltd.) at 40° C., 0.1 MPa and at a rate of 0.5 m/min. Then, the base material of the adhesive sheet was peeled off and a copper plate having a thickness of 150 μm (10 mm×50 mm, wiped with toluene and dried at room temperature for two hours) was laminated on the adhesive layer such that about 30 mm of the 50 mm length of the copper plate was superimposed on the adhesive layer, using the same laminator at 80° C., 0.1 MPa and at a rate of 0.5 m/min. Subsequently heating and thermosetting was carried out under air at 175° C. for 5 hours and the measurement of adhesive strength was performed.

In the measurement of the adhesive strength, force required to peel off the copper plate at an angle of 90° and at a rate of 50 mm/min (adhesive strength) was measured under the conditions of 23° C. and 50% RH by using a universal tensile testing machine (Autograph AG-IS manufactured by Shimadzu Corporation) while the wafer was fixed.

[Maximum Particle Size Measurement for Thermosetting Accelerating Agent (C) in Adhesive Layer]

A dried adhesive layer of each adhesive sheet of Examples and Comparative Examples was observed with a scanning electron microscope (SEM) (S-4700 (unit name), manufactured by Hitachi, Ltd. accelerating voltage 15 kV) so as to measure the maximum particle size of the thermosetting accelerating agent. An SEM picture of an adhesive layer was taken at a magnification of 5,000 to 10,000 times first. In the resultant picture, the particle size of the thermosetting accelerating agent was measured with a scale, and the maximum was regarded as the maximum particle size.

Furthermore, the components constituting the adhesive composition are as follows.

(A) Epoxy thermosetting resin: Bisphenol A diglycidyl ether (Epicoat 828, epoxy equivalent: 189 g/eq, manufactured by Japan Epoxy Resins Co., Ltd.)

(B) Themosetting agent: Novolak type phenol resin (Shonol BRG-556, phenolic hydroxyl equivalent: 104 g/eq, manufactured by Showa Highpolymer Co., Ltd.)

(C) Themosetting accelerating agent (C)-1. Boron trifluoride 2-methyl 1H-imidazole (AC4B50, manufactured by Stella Chemifa Corporation, soluble in methyl ethyl ketone)

(C)-2. 2-phenyl-4-methyl-5-hydroxymethylimidazole (2P4MHZ, manufactured by Shikoku Chemicals Corporation, insoluble in methyl ethyl ketone)

(C)-3. 2-ethyl-4-methylimidazole (2E4MZ, manufactured by Shikoku Chemicals Corporation, soluble in methyl ethyl ketone)

(D): Acrylic polymer consisting of methyl acrylate/2-hydroxyethyl acrylate (85% by weight/15% by weight) (weight average molecular weight: around 400000, Tg: 4° C.)

(E) Silane coupling agent (MKC Silicate MSEP2, manufactured by Mitsubishi Chemical Corporation)
(F) Cross-linking agent: Aromatic polyisocyanate (Coronate L, manufactured by Nippon Polyurethane Industry Co., Ltd.)
(G) Energy beam-polymerizable compound: Bifunctional acrylate (KAYARAD R-684, manufactured by Nippon Kayaku Co., Ltd.)
(H) Photopolymerization initiator (Irgacure 184, manufactured by Ciba Specialty Chemicals K. K.)

A polyethylene film (thickness: 100 μm, surface tension: 33 mN/m) was used as a base material for the adhesive sheet.

Examples and Comparative Examples

Adhesive compositions having compositions shown in Table 1 were used. Values in the Table represent parts by weight reduced to a solid content. The adhesive compositions having compositions shown in Table 1 were dissolved in methyl ethyl ketone such that the concentration of the solid content was 40% by weight. Then, the adhesive compositions were applied on a release film (SP-PET3811(S), manufactured by Lintec Corporation) subjected to silicone treatment so that a thickness after drying was 5 μm, dried (drying conditions: 100° C., one minute) and then stuck onto a base material to transfer the adhesive layer on the base material, whereby adhesive sheets were obtained.

Surface mounting property and adhesive strength of the resultant adhesive sheets were evaluated after leaving the sheets in the 28° C. air for one month, whereby storage stability was evaluated. The results are shown in Table 2.

The adhesive sheets used in Examples 1 to 5 have good surface mounting property and adhesive strength after long storage. On the other hand, the adhesive sheets used in Comparative Examples 2 and 3 gave bad results. This is because the thermosetting accelerating agent contained in the adhesive layer of the adhesive sheets used in Comparative Examples 2 and 3 was active as a thermosetting accelerating agent at 28° C.

Maximum Particle Size Measurement Results for Thermosetting Accelerating Agent (C) in Adhesive Layer In Examples 1 to 5 and Comparative Examples 2 and 3, no particulates were found in the SEM pictures at a magnification of 10,000 times. In Comparative Example 1, particulates having a maximum particle size of 30 μm were identified. Note that, among the raw materials of the adhesive composition, only the thermosetting accelerating agent is a component that can be present in an adhesive layer as particle, therefore the particulates are the thermosetting accelerating agent. No particulates are found in an adhesive not containing thermosetting accelerating agent.

TABLE 2

| | Coatability of 5 μm thick adhesive layer | Results of evaluation of surface mounting property after long storage (*) | Results of evaluation of adhesive strength after long storage, N |
|---|---|---|---|
| Example 1 | good | 25/25 | 15 |
| Example 2 | good | 25/25 | 12 |
| Example 3 | good | 25/25 | 17 |
| Example 4 | good | 25/25 | 16 |
| Example 5 | good | 25/25 | 15 |
| Comparative Example 1 | bad | — | — |
| Comparative Example 2 | good | 0/25 | 1 |
| Comparative Example 3 | good | 0/25 | 2 |

(*) number of packages which did not cause floating and peeling at the adhered part and did not have package cracks/number of the packages subjected to the test

What is claimed is:

1. An adhesive sheet comprising a base material and, formed thereon, an adhesive layer comprising: an epoxy thermosetting resin (A), a thermosetting agent (B) and a thermosetting accelerating agent (C), wherein the thermosetting accelerating agent (C) is soluble in methyl ethyl ketone and inactive as a thermosetting accelerating agent at room temperature, wherein the thermosetting accelerating agent (C) is boron trifluoride 2-methyl imidazole, wherein the adhesive layer has a thickness of about 0.5 to 5 μm, wherein the adhesive layer is obtained by diluting a composition comprising the epoxy thermosetting resin (A), the thermosetting agent (B), and the thermosetting accelerating agent (C) with methyl ethyl ketone as a solvent, coating the resulting solution on the base material, and vaporizing the solvent.

2. The adhesive sheet according to claim 1, wherein the thermosetting accelerating agent (C) in the adhesive layer has a maximum particle size of less than or equal to 1 μm.

* * * * *

TABLE 1

| Component | Example 1 | Example 2 | Example 3 | Example 4 | Example 5 | Comparative Example 1 | Comparative Example 2 | Comparative Example 3 |
|---|---|---|---|---|---|---|---|---|
| A | 64.5 | 64.5 | 64.5 | 64.5 | 64.5 | 64.5 | 64.5 | 64.5 |
| B | 35.5 | 35.5 | 35.5 | 35.5 | 35.5 | 35.5 | 35.5 | 35.5 |
| C-1 | 1.0 | 1.0 | 0.1 | 0.005 | 3.0 | | | |
| C-2 | | | | | | 1.0 | | |
| C-3 | | | | | | | 1.0 | 1.0 |
| D | 250 | 250 | 250 | 250 | 250 | 250 | 250 | 250 |
| E | 3.0 | 3.0 | 3.0 | 3.0 | 3.0 | 3.0 | 3.0 | 3.0 |
| F | 3.0 | 3.0 | 3.0 | 3.0 | 3.0 | 3.0 | 3.0 | 3.0 |
| G | | 35 | | | | | | 35 |
| H | | 1.5 | | | | | | 1.5 |
| Total of A and B | 100 | 100 | 100 | 100 | 100 | 100 | 100 | 100 |

Unit: Parts by weight (value reduced to a solid content)